United States Patent [19]
Shinozaki

[11] Patent Number: 6,084,802
[45] Date of Patent: Jul. 4, 2000

[54] SEMICONDUCTOR INTEGRATED CIRCUIT DEVICE

[75] Inventor: Naoharu Shinozaki, Kawasaki, Japan

[73] Assignee: Fujitsu Limited, Kanagawa, Japan

[21] Appl. No.: 09/022,492

[22] Filed: Feb. 12, 1998

[30] Foreign Application Priority Data

Aug. 11, 1997 [JP] Japan .................................... 9-216691

[51] Int. Cl.[7] .................................................. G11C 16/04
[52] U.S. Cl. ...................................... 365/189.05; 365/233
[58] Field of Search .............................. 365/189.05, 233, 365/194; 327/158

[56] References Cited

U.S. PATENT DOCUMENTS

| | | | |
|---|---|---|---|
| 5,740,123 | 4/1998 | Uchida | 365/233 |
| 5,822,255 | 10/1998 | Uchida | 365/194 |
| 5,926,046 | 7/1999 | Uchida | 327/158 |

*Primary Examiner*—David Nelms
*Assistant Examiner*—Anh Phung
*Attorney, Agent, or Firm*—Arent Fox Kintner Plotkin & Kahn

[57] ABSTRACT

A pipe-line control of internal circuits is performed by an internal clock whose timing does not depend on a predetermined phase difference to the phase of an external clock. To control the timing of the output signal from an output circuit to the predetermined phase difference with respect to the phase of the external clock, a delay circuit is inserted at the subsequent stage of the last stage of pipe-line gate. The delay time of this delay circuit is so controlled as to set the timing of the output signal to have the predetermined phase difference to the phase of the external clock.

13 Claims, 15 Drawing Sheets

INTERNAL CIRCUIT OF ONE EMBODIMENT

INTERNAL CIRCUIT WITH A PIPE-LINE STRUCTURE

TIMING CHART (2) OF FIG.1

INTERNAL CIRCUIT OF ONE EMBODIMENT

EXAMPLE OF SDRAM

DELAY CONTROLLER 38

36 PHASE COMPARATOR

DUMMY I/O H 41H

DUMMY I/O L 41L

SEMICONDUCTOR INTEGRATED CIRCUIT DEVICE

BACKGROUND OF THE INVENTION

1. Field of the Invention

The present invention relates to a semiconductor integrated circuit device, such as an SDRAM (Synchronous Dynamic Random Access Memory) or the like, whose internal circuits operate in synchronism with an external clock and whose output circuit outputs an output signal with a predetermined phase difference or relation with respect to the external clock.

2. Description of the Related Art

As the clocks of CPUs in recent computer systems become faster, an attempt is made to increase the access speeds of DRAMs which are used as a main memory device. As such a fast DRAM has been developed a synchronous DRAM (hereinafter simply called SDRAM) whose apparent access time is shortened by allowing internal circuits to operate in pipe-line in synchronism with an externally supplied clock.

This SDRAM receives, for example, a column address signal in synchronism with the external clock and outputs an output signal like data from the output circuit after several clocks. As one example, the SDRAM has such an internal structure that the column associated circuit from the column address buffer to the data output circuit is separated into plural stages of circuits with pipe-line gates provided between those circuits and the opening and closing of the pipe-line gates is controlled by an internal clock which has a predetermined phase difference to the external clock.

There is a demand from the system side for the SDRAM with the pipe-line structure to output an output signal like data at the timing of a predetermined phase difference with respect to an external clock. This demand is intended to make the gray zone of the access hold time of the output data signal to approach zero as close as possible. To meet this demand, the phase of the internal clock in the SDRAM is controlled in such a way that the internal clock has a predetermined phase difference to the external clock. This can permit a data signal to be output at the timing of a predetermined phase difference to the phase of the external clock after several clocks after the column address is input. This operation can allow the system side to receive the output signal of the memory at a quicker timing with respect to an external clock of a short period and to receive the output signal of the memory at a slower timing with respect to an external clock of a longer period.

While the delay characteristics of the internal circuits having a pipe-line structure are almost fixed regardless of the period of the external clock, however, the timing of the internal clock depends on the period of the external clock. When the period of the external clock is extremely long or short, therefore, the timings of the outputs from the internal circuits are unbalanced with the timing of the internal clock which controls the opening and closing of the pipe-line gates. In this case, the operational margin of the internal circuits may not be secured.

SUMMARY OF THE INVENTION

Accordingly, it is an object of the present invention to provide a semiconductor integrated circuit device which can secure the operational margin of internal circuits with a pipe-line structure and in which the timing of an output signal from an output circuit can be set to have a predetermined phase difference to an external clock, irrespective of the length of the period of the external clock.

It is another object of this invention to provide a semiconductor memory device which can keep the timing of an output signal from an output circuit at a predetermined phase difference to a supplied external clock in accordance with the period of the external clock, and can guarantee the proper operation of internal circuits with a pipe-line structure.

To achieve the above objects, according to this invention, the pipe-line control of internal circuits is performed by an internal clock whose timing does not depend on a predetermined phase difference to the phase of an external clock. To control the timing of the output signal from an output circuit to the predetermined phase difference with respect to the phase of the external clock, a delay circuit is inserted at the subsequent stage of the last stage of pipe-line gate. The delay time of this delay circuit is so controlled as to set the timing of the output signal to have the predetermined phase difference to the phase of the external clock.

The delay control of this delay circuit is carried out by a delay control signal generated from a delayed lock loop circuit, which sets a reference clock having a predetermined phase difference to the external clock in phase with a clock having the same timing as an output signal generated by a dummy delay circuit or the like.

As this delay circuit is inserted between the subsequent stage of the last stage of pipe-line gate and the output circuit, it has at least one delay path which is maintained, irrespective of the delay control signal from the delayed lock loop circuit, in such a manner that the high-impedance control of the output terminal is carried out without delay.

Further, the delay circuit is so designed that a first delay control signal for controlling the timing at which the output signal changes to an H level from an L level to a predetermined phase difference and a second delay control signal for controlling the timing at which the output signal changes to the L level from the H level from to the predetermined phase difference are switched from one to the other in accordance with output data.

According to one aspect of this invention, a semiconductor integrated circuit device having plural stages of internal circuits operable in pipe-line and an output circuit, connected to the internal circuits, for outputting an output signal with a predetermined phase relation to an external clock, comprises:

pipe-line gates, provided between the internal circuits and between one of the internal circuits and the output circuit, opening and closing of the pipe-line gates being controlled by an internal clock; and a delay circuit provided at a subsequent stage of the last stage of pipe-line gate provided between the internal circuit and the output circuit, and having a delay time for permitting the output signal to be output with the predetermined phase relation.

According to another aspect of this invention, a semiconductor memory device having plural stages of column associated internal circuits supplied with a column address signal and operable in pipe-line and an output circuit, connected to the column associated internal circuits, for outputting a data output signal with a predetermined phase relation to an external clock, comprises:

pipe-line gates, provided between the column associated internal circuits and between the column associated internal circuit and the output circuit, opening and closing of the pipe-line gates being controlled by an internal clock having a phase advanced from that of the external clock by a time equivalent to a delay time of the output circuit; and a delay circuit provided at a subsequent stage of the last stage of pipe-line gate provided between the column associated internal circuit and the output circuit, and having a delay time corresponding to the predetermined phase relation.

DETAILED DESCRIPTION OF THE PREFERRED EMBODIMENT

A preferred embodiment of the present invention will now be described with reference to the accompanying drawings. It should however be noted that this embodiment is to be considered as illustrative and not restrictive and the invention is not to be limited to the details given hereunder, but may be modified within the scope of the appended claims.

Figure 1:
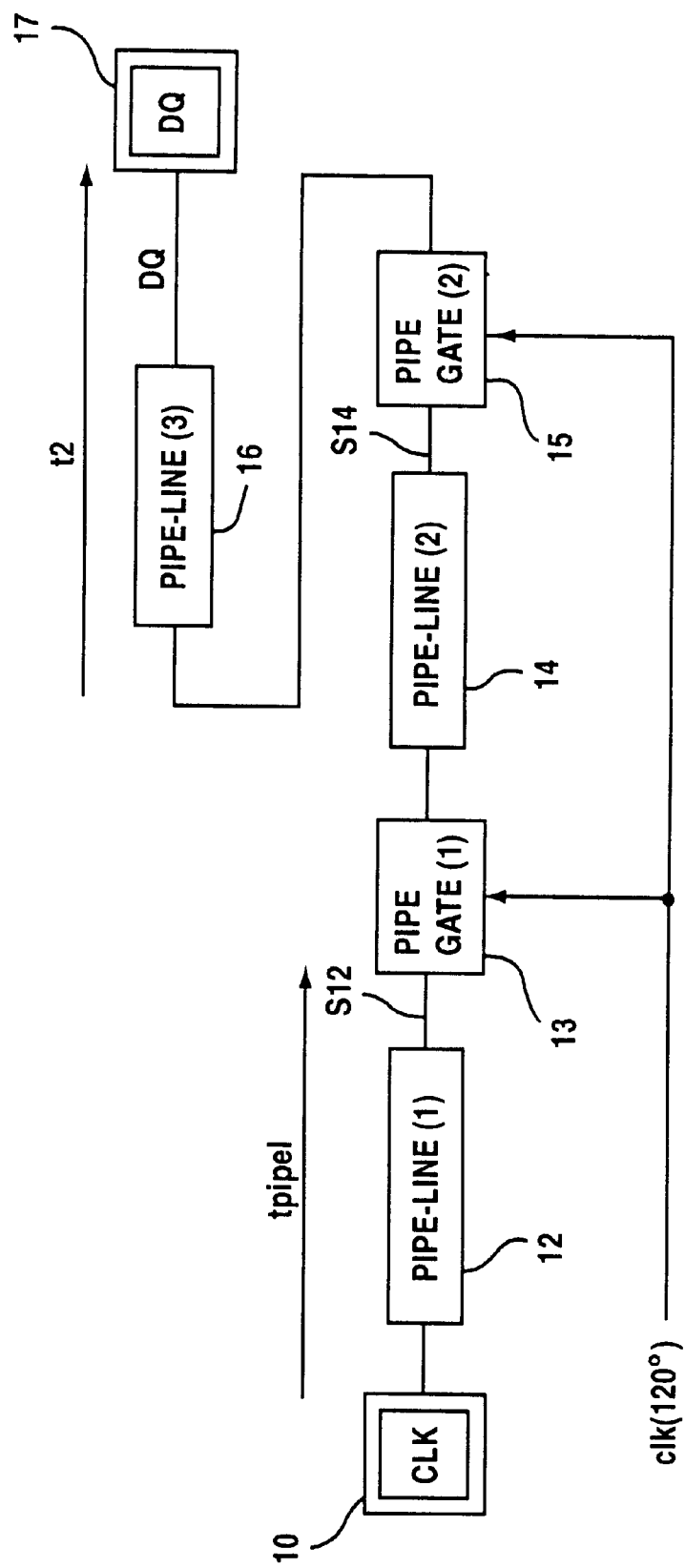
FIG. 1 is a diagram exemplifying internal circuits with a pipe-line structure.

FIG. 1 is a diagram exemplifying internal circuits with a pipe-line structure. In this example, an external clock CLK is input to an external clock input terminal 10, and a first stage of pipe-line circuit 12 operates at the timing of that external clock. An internal clock clk, which has, for example, a predetermined phase difference to the external clock CLK, is given to a pipe-line gate 13 between the first stage of pipe-line circuit 12 and a second stage of pipe-line circuit 14, and a pipe-line gate 15 between the second stage of pipe-line circuit 14 and an output circuit 16 to control the opening and closing timings of those gates. The third stage of pipe-line circuit is the output circuit 16 whose output signal DQ is output from an output terminal 17. The internal clock clk is generated by an unillustrated internal clock generator.

Figure 2:
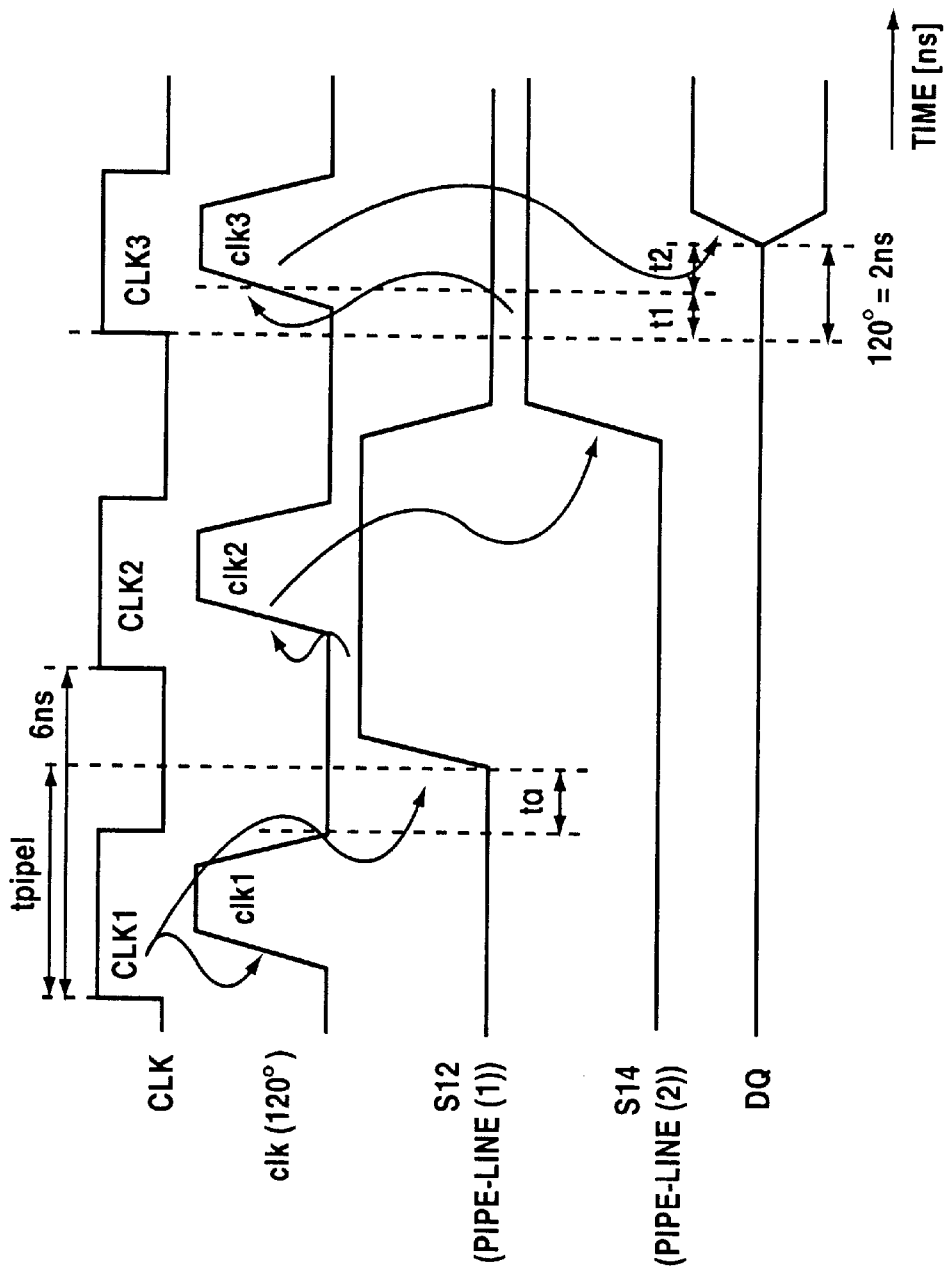
FIG. 2 is a diagram showing a timing chart for the internal circuits in FIG. 1.

FIG. 2 is a diagram showing a timing chart for the internal circuits in FIG. 1. In this case, for example, the external clock CLK has a short period of 6 ns. In the internal circuits in FIG. 1, the first stage of pipe-line circuit 12 operates at the rising of an external clock CLK1, and its output signal S12 rises at the illustrated timing. Each internal clock clk has a predetermined phase difference to the external clock CLK or a delay time t1 which is so controlled that the output signal DQ is delayed by 2 ns with respect to the external clock CLK. The first pipe-line gate 13 is opened at the rising of the internal clock clk2 which is delayed by a predetermined phase from the second external clock CLK2, causing an output S12 to be supplied to the second stage of pipe-line circuit 14. Therefore, the second stage of pipe-line circuit 14 starts operating at the rising of the internal clock clk2, and its output signal S14 rises after a predetermined delay as illustrated. Further, the output signal S14 is supplied to the output circuit 16 at the last stage at the rising of the internal clock clk3 which is delayed by a predetermined phase from the third external clock CLK3.

The output circuit 16 needs a delay time t2 from the reception of the output signal S14 of the second stage of pipe-line circuit 14 to the generation of the output signal DQ. With t1 being the delay time between the external clock CLK3 and the internal clock clk3, a delay time (t1+t2) is so set as to correspond to a period of 120 degrees of the period of the external clock CLK. That is, the internal clock clk has a phase difference of 120 degrees to the external clock CLK, including, strictly speaking, the delay time t2 of the output circuit 16.

In the internal circuits exemplified in FIG. 1, the output signal S12 of the first stage of pipe-line circuit 12 is generated at the operational delay time tpipe1 after the rising edge of the first external clock CLK1. This timing lies after a sufficient operational margin ta from the falling of the internal clock clk1 corresponding to the first external clock CLK1, and before the rising of the internal clock clk2 corresponding to the second external clock CLK2. Thus, the pipe-line gate 13 properly transfers the output signal S12 to the second stage of pipe-line circuit 14.

Figure 3:
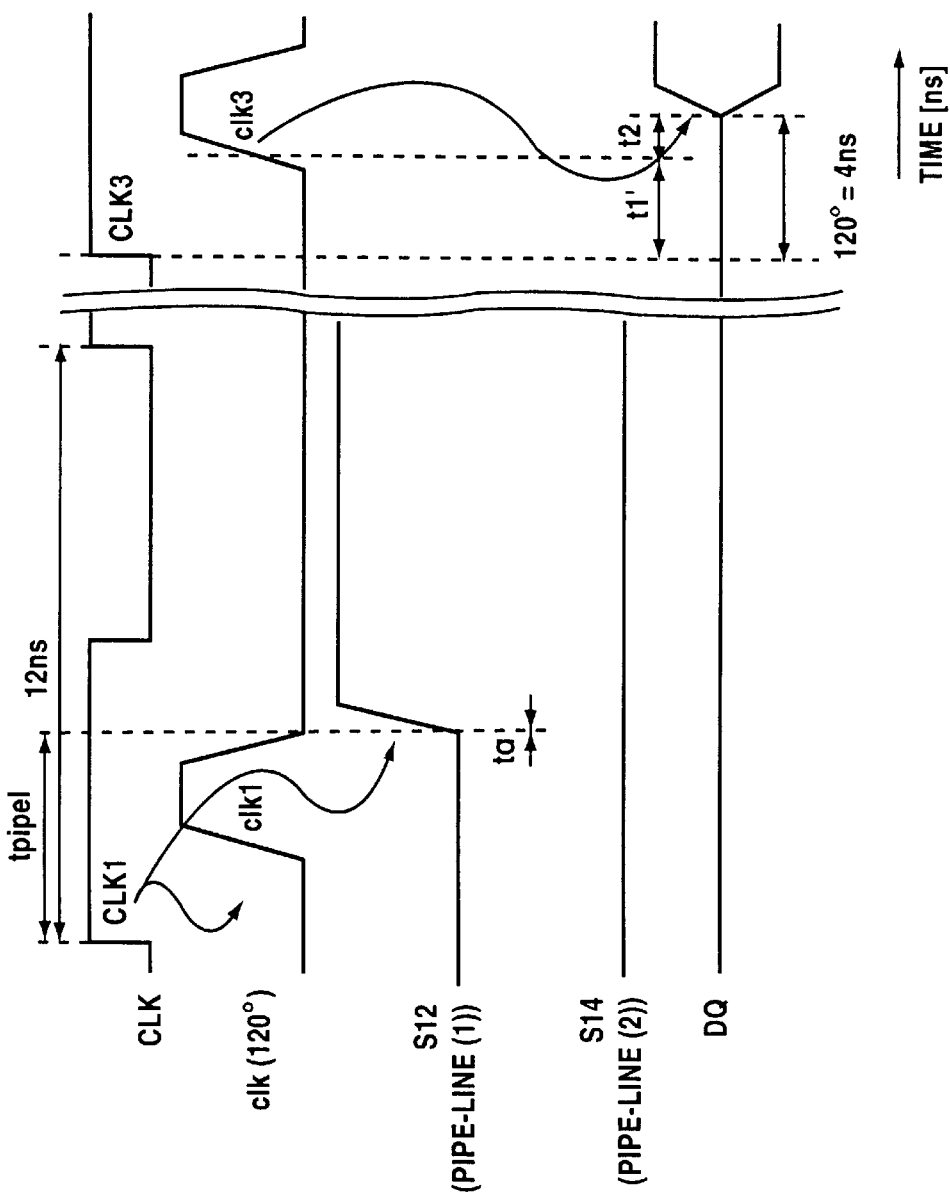
FIG. 3 is a diagram showing another example of the timing chart for the internal circuits in FIG. 1.

FIG. 3 is a diagram showing another example of the timing chart for the internal circuits in FIG. 1. In this example, the period of the external clock CLK is 12 ns, a double the period in the example of FIG. 2. An SDRAM is demanded such that as the period of the external clock CLK gets longer, the output timing for the data output DQ should be delayed. That is, the data output DQ is demanded to always keep a given phase difference (120 degrees) to the external clock CLK. Accordingly, the internal clock clk is considerably delayed from the external clock CLK in the timing chart exemplified in FIG. 3. That is, the delay time becomes t1' in the figure.

The operational delay characteristic tpipe1 of the first stage of pipe-line circuit 12 is fixed regardless of the period of the external clock CLK. The output signal S12 of the first stage of pipe-line circuit 12 therefore rises around the falling of the internal clock clk1 corresponding to the first external clock CLK1. While the output signal S12 should be transferred to the second stage of pipe-line circuit 14 at the rising of the internal clock clk2 corresponding to the second external clock CLK2 as mentioned above, the aforementioned operational margin ta becomes substantially 0, which may lead to a malfunction such that the output signal S12 is transferred at the timing of the internal clock clk1. As the external clock CLK is delayed further, the probability of the malfunction becomes higher.

The internal circuits with the pipe-line structure shown in FIG. 1 carry out a pipe-line operation as the first stage of circuit 12 operates at the timing of the external clock CLK1, the second stage of circuit 14 operates at the timing of the internal clock clk2 and then the output circuit 16 at the last stage operates at the timing of the internal clock clk3. As the period of the external clock CLK becomes longer as shown in FIG. 3, however, the pipe-line operation will not be carried out properly.

Figure 4:
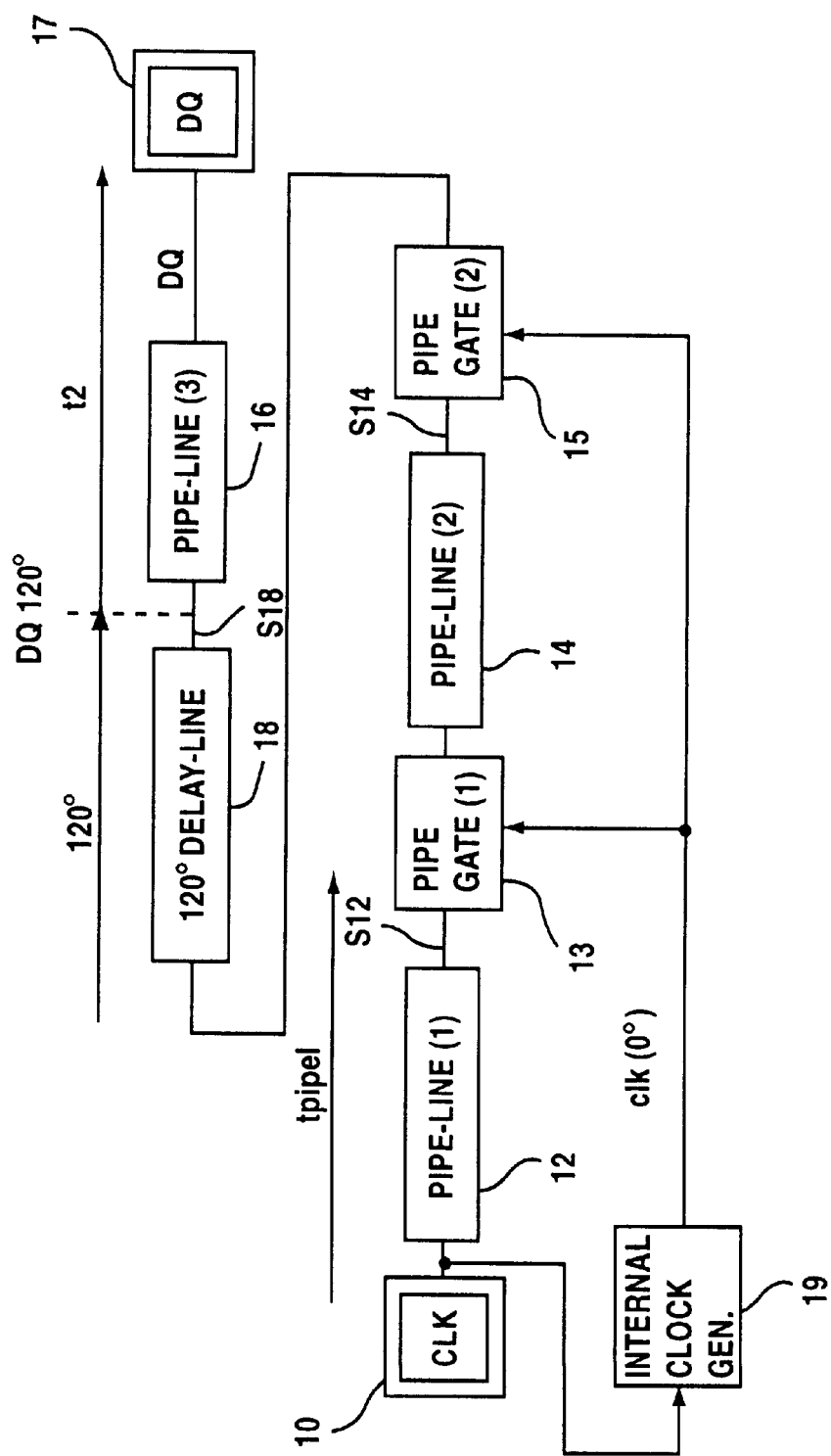
FIG. 4 is a diagram exemplifying a circuit according to one embodiment of this invention.

FIG. 4 is a diagram exemplifying a circuit according to one embodiment of this invention. Like or same reference numerals are given to those components which are the same as the corresponding components in FIG. 1. The internal circuits with a pipe-line structure include a first stage of circuit 12, a second stage of circuit 14 and an output circuit 16 at the last stage, a pipe-line gate 13 provided between the first and second stages of circuits 12 and 14, a pipe-line gate 15 provided between the second stage of circuit 14 and the output circuit 16, and a delay circuit 18 provided at the subsequent stage of the pipe-line gate 15 between the output circuit 16 and the previous stage of internal circuit 14 to generate a predetermined phase difference. Further provided is an internal clock generator 19 which receives an external clock CLK and generates an internal clock clk which has a phase leading that of the external clock CLK by a time equivalent to the delay time of the output circuit 16.

The internal clock clk is not restricted to the mentioned one, but may be a clock which is delayed by a fixed time, from the external clock CLK for example. In other words, the internal clock clk should have such a timing as to close the pipe-line gates 13 and 15 while the first stage of internal circuit 12 is in operation and before the output signal S12 is output from this circuit 12.

Figure 5:
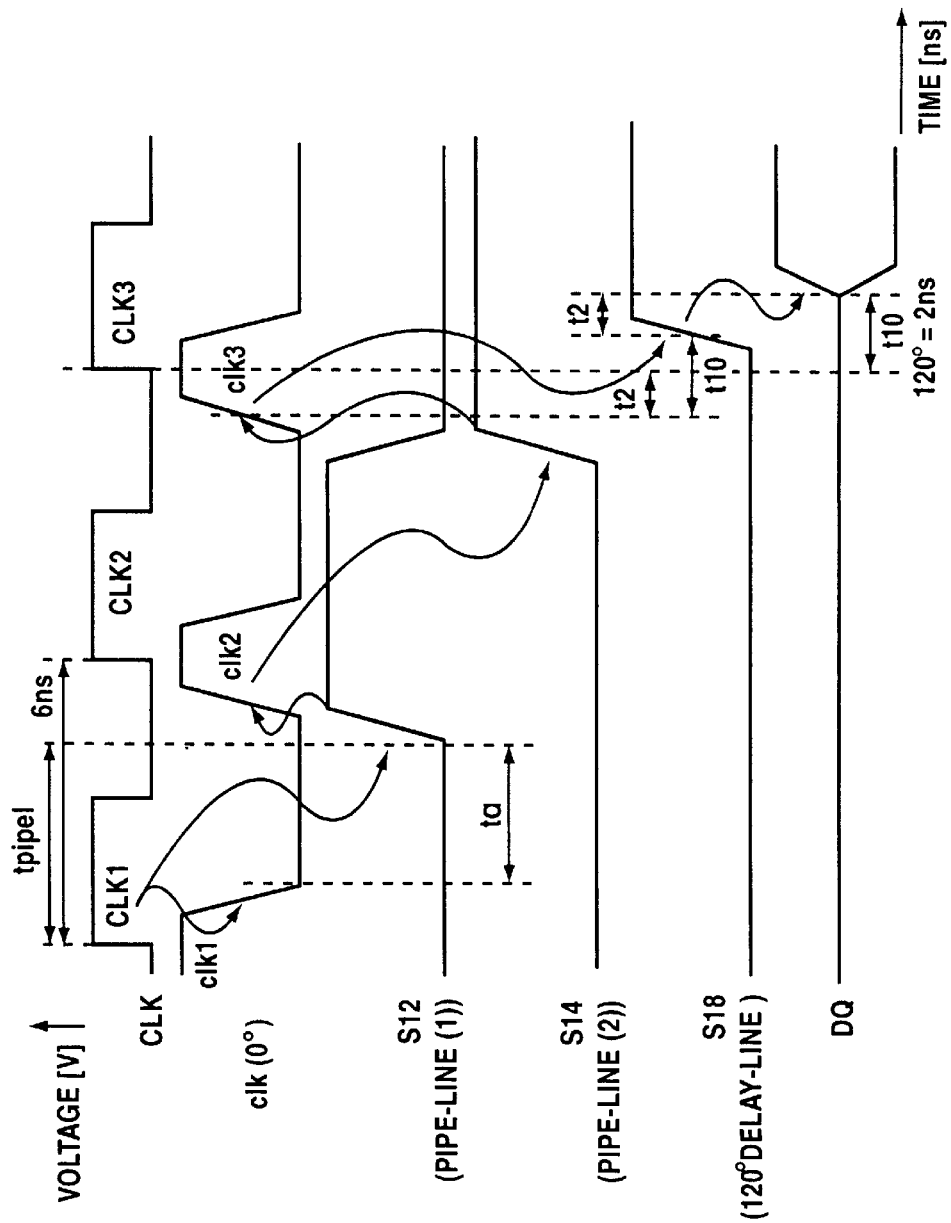
FIG. 5 is a diagram showing a timing chart for the circuits in FIG. 4.

FIG. 5 is a diagram showing a timing chart for the circuits in FIG. 4. In this example, the external clock CLK, like the one in FIG. 2, has a short period of 6 ns. The internal clock generator 19 generates an internal clock clk whose phase leads the phase of the external clock CLK by a time equivalent to the delay time of the output circuit.

The first stage of pipe-line circuit 12 starts an operation synchronous with the rising of the external clock CLK1. As a result, the output signal S12 of the pipe-line circuit 12 rises after an operational delay time tpipe1 thereof. As the internal clock clk1 falls sufficiently before the rising of the output signal S12, it is possible to secure a sufficient operational margin ta from the falling of the internal clock clk1 to the rising of the output signal S12.

The rising of the internal clock clk2 enables the pipe-line gate 13 contractive, allowing the output signal S12 to be supplied to the second stage of pipe-line circuit 14. The second stage of pipe-line circuit 14 thus starts operating in synchronism with the rising of the internal clock clk2. Then, the output signal S14 of the pipe-line circuit 14 is supplied to the delay circuit 18 via the pipe-line gate 15 which is enabled in synchronism with the rising of the internal clock clk3.

The delay circuit 18 transfers the output signal S14, which has been supplied at the rising timing of the internal clock clk3, to the output circuit 16 at the last stage as an output signal S18 after a predetermined delay time t10. This delay time t10 is so set that the final output signal DQ is output with a phase delay of 120 degrees of the external clock CLK from the rising of the external clock CLK3. In this example, the operational delay time of the output circuit 16 is t2 which is substantially equal to a time equivalent to the phase difference between the internal clock and the external clock. The delay time t10 of the delay circuit 18 therefore coincides with a delay of 120 degrees of the phase of the external clock CLK.

When the phase difference as shown in FIG. 5 is provided between the external clock CLK and the internal clock clk, the pipe-line gate 13 can be closed by the internal clock clk sufficiently before the rising of the output signal S12 of the first stage of internal circuit 12.

If the delay circuit 18 as shown in FIG. 4 is not provided, on the other hand, the output data DQ is output from the output circuit 16 at the same time as the external clock CLK rises. In this respect, the delay circuit 18 with the delay time t10 is provided to permit the output data DQ to be output with a predetermined phase difference (a delay of 120 degrees) with respect to the rising timing of the external clock CLK.

Control to advance the rising timing of the internal clock clk by a delay time t2 of the delay circuit 16 from the rising timing of the external clock CLK and to allow the output data DQ to be output at a timing delayed by t10+t2 from the rising timing of the internal clock clk can be executed accurately by a delayed lock loop circuit which will be discussed later. According to this embodiment, therefore, the output timing for output data can be delayed precisely by a phase of 120 degrees from the rising timing of the external clock CLK.

Figure 6:
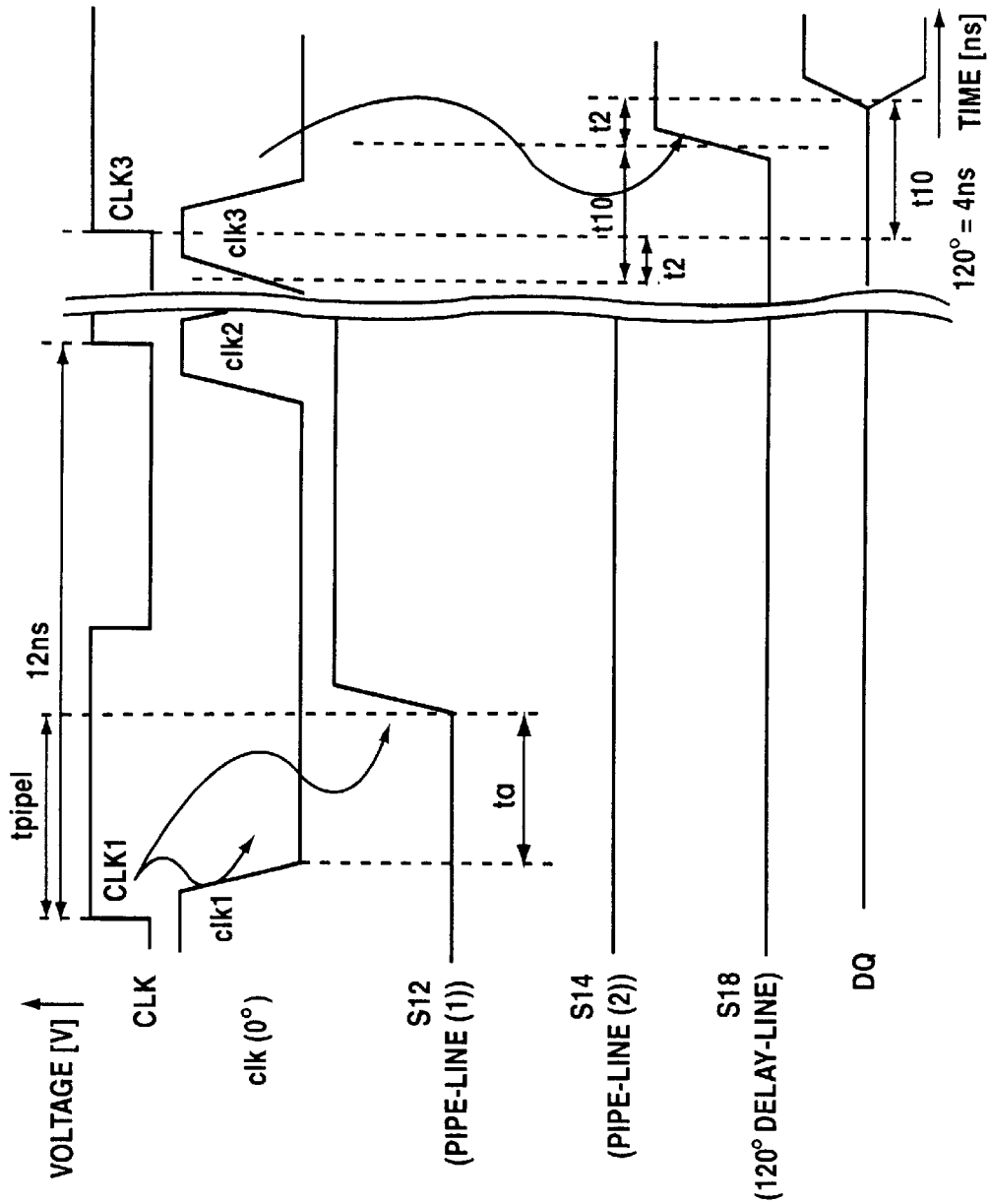
FIG. 6 is a diagram exemplifying another timing chart for the circuits in FIG. 4.

FIG. 6 is a diagram exemplifying another timing chart for the circuits in FIG. 4. In this example, the external clock CLK has a long period of 12 ns. While the operational margin ta of the first stage of pipe-line circuit 12 is hardly present in the example shown in FIG. 3, the timing at which the internal clock clk1 is generated is not delayed even when the period of the external clock CLK becomes longer in the embodiment. Thus, the output S12 of the pipe-line circuit 12 is produced with a sufficient operational margin ta since the falling of the internal clock clk1. Then, the pipe-line gate 13 is enabled (conductive) in synchronism with the rising of the internal clock clk2, causing the output signal S12 to be supplied to the second stage of pipe-line circuit 14.

The last stage of pipe-line gate 15 is enabled at the rising of the second internal clock clk2, permitting the output signal S14 of the second stage of pipe-line circuit 14 to be given to the delay circuit 18. The delay circuit 18 sends the signal S14 to the last-stage output circuit 16 as the output signal S18 after the delay time t10 since the rising of the third internal clock clk3.

The delay circuit 18 can be inserted anywhere after the last pipe-line gate 15. It is however preferable not to provide an internal delay circuit between the output of the output circuit 16 and the output terminal 17. It is thus preferable that the delay circuit 18 should be provided between the output circuit 16 and the last pipe-line gate 15 or inside the output circuit 16.

According to this embodiment, as mentioned above, control on the gates between the internal pipe-line circuits with a pipe-line structure is carried out by using the internal clock clk whose phase leads that of the external clock by a time equivalent to the delay time of the output circuit 16. The pipe-line operation of the internal circuits is guaranteed regardless of the type of the external clock CLK which is externally supplied. To meet the demand of generating the output signal DQ after a predetermined phase from the external clock CLK generated on the system side, a delay circuit is inserted at the subsequent stage of the last pipe-line gate to provide such a delay time as to allow the final output signal DQ to be output with a phase difference as specified. Since this delay time varies depending on the period of the external clock CLK, it can conform to the standards of SDRAMs.

Figure 7:
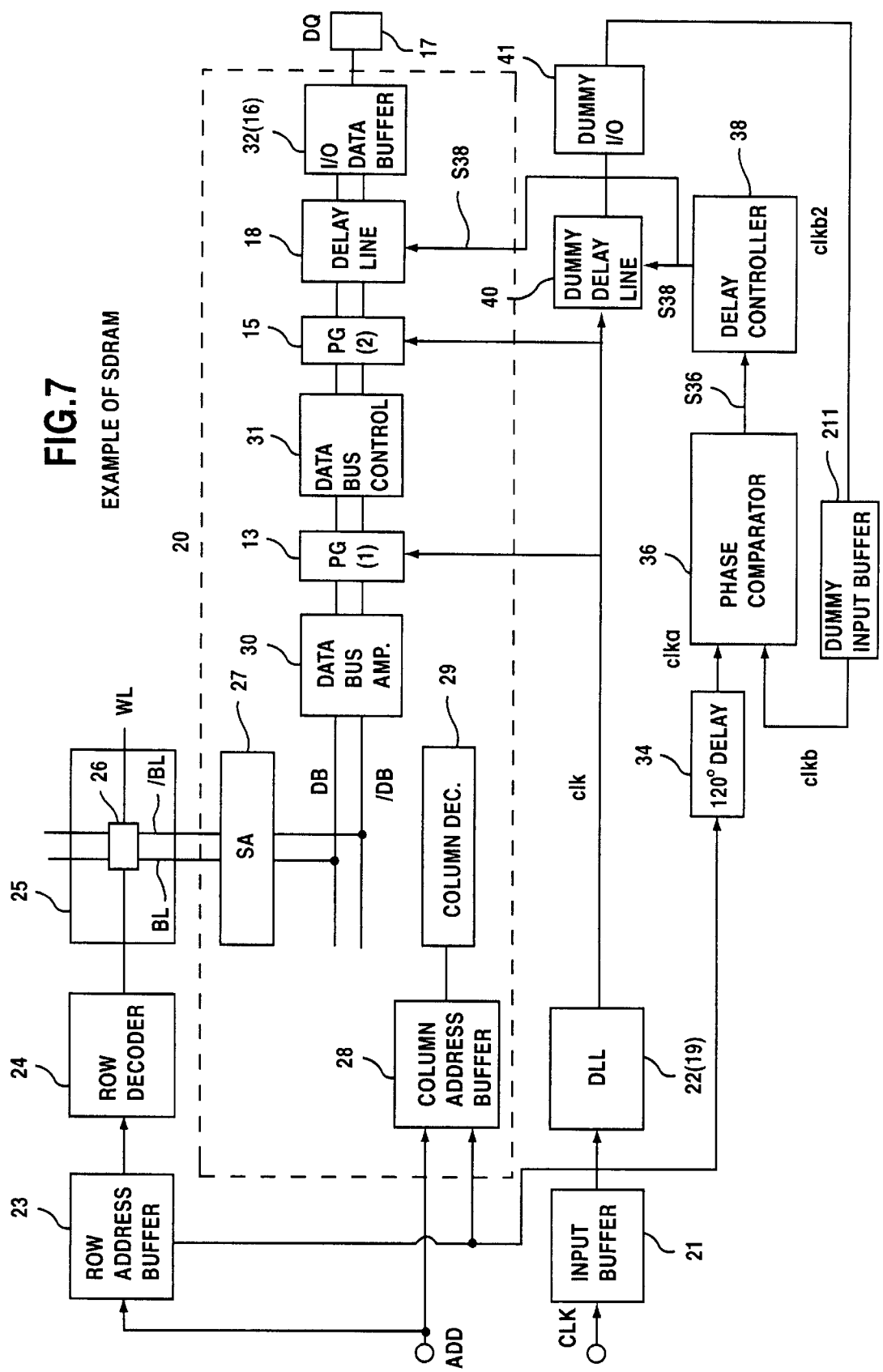
FIG. 7 is a diagram showing a specific example in which the above-described circuit is adapted to an SDRAM.

A specific description will now be given of the case where the above-described circuit is adapted to an SDRAM. FIG. 7 is a diagram showing a specific example in which the above-described circuit is adapted to an SDRAM. In this example, a column associated circuit 20 has a pipe-line structure. A row address and a column address are supplied through a common address terminal Add. The row address which is supplied in synchronism with the first external clock is sent into a row address buffer 23 to be amplified there, and the amplified row address is supplied to a row decoder 24. A word line WL which is selected by the row decoder 24 is driven to select a memory cell 26. Data in the memory cell 26 is output onto one of bit lines BL and /BL, and is amplified, together with a reference voltage of the other bit line, by an associated sense amplifier 27. The process up to this point is the operation of the row-address side circuit.

Thereafter, the column address is supplied to the address terminal Add in synchronism with the external clock CLK and is amplified by a column address buffer 28. The address signal is decoded by a column decoder 29, and a selected one of the sense amplifiers 27 is connected to a pair of data bus lines DB and /DB. Data on the pair of data bus lines DB and /DB are further amplified by a data bus amplifier 30. The circuits up to this data bus amplifier 30 in the column associated circuit 20 correspond to, for example, the first stage of pipe-line circuit 12 in FIG. 4.

The external clock CLK is temporarily amplified by a clock input buffer 21 and is then given to a DLL (Delayed Lock Loop) circuit 22 which is an internal clock generator. The DLL circuit 22 generates an internal clock clk whose phase leads that of the external clock by a time equivalent to the delay time of the output circuit 16. That is, the internal clock clk has a delay timing which does not depend on the period of the external clock. The specific structure of this DLL circuit is illustrated in, for example, Unexamined Japanese Patent Publication No. Hei 8-339988 filed on Dec. 19, 1996.

The internal clock clk is supplied to the pipe-line gate 13 to open the pipe-line gate 13 in synchronism with the internal clock clk. Further, a data bus controller 31, which corresponds to the second stage of pipe-line circuit 14 in FIG. 4, performs a predetermined control operation. The pipe-line gate 15 is opened in synchronism with the internal clock clk, causing the output signal of the data bus controller 31 to be given to the delay circuit 18. The delay circuit 18 produces a delay corresponding to 120 degrees of the phase of the external clock CLK and delayed read data is output to a data output terminal DQ from an output data buffer 32.

The delay control on the delay circuit 18 is performed by a DLL circuit that comprises a phase comparator 36, a delay controller 38 which generates a delay control signal S38 according to the result of the phase comparison, a dummy delay circuit 40 which, like the delay circuit 18, delays the internal clock clk, a dummy output circuit 41 which has a delay equivalent to that of the output data buffer 32, and a dummy input buffer 211 which has a delay time equivalent to that of the input buffer 21. The phase comparator 36 receives a clock clka, which is the external clock CLK delayed by a phase of 120 degrees, as a reference signal, and receives a clock clkb, which is the internal clock clk delayed by the dummy delay circuit 40, the dummy output circuit 41 and the dummy input buffer 211, as a to-be-controlled clock (variable clock). Therefore, the clock clkb has substantially the same timing as the timing of the output DQ. The clock clka may be a clock which is obtained by delaying the internal clock clk by a phase of 120 degrees and then frequency-dividing the resultant clock by four, for example.

The phase comparator 36 detects the phase statuses of both input clocks clka and clkb, and sends a detection signal S36 to the delay controller 38. When the detection signal S36 indicates that the clock clkb leads the reference clock clka, the delay controller 38 generates the delay control signal S38 which elongates the delay time of the dummy delay circuit 40 to delay the clock clkb. When the clock clkb is delayed from the reference clock clka, the delay controller 38 generates the delay control signal S38 which shortens the delay time of the dummy delay circuit 40 to advance the clock clkb. As a result, the clock clkb which is the output of the dummy input buffer 211 is so controlled as to be in phase with the reference clock clka.

As the delay amount of the delay circuit 18, like that of the dummy delay circuit 40, is controlled by the delay control signal S38, the timing of sending data from the output data buffer 32 to the output data terminal DQ is the same as the timing of a clock clkb2 output from the dummy output circuit 41. The reference clock clka is delayed by a phase of 120 degrees from the external clock CLK, and the internal clock clk has a phase leading that of the external clock by a time equivalent to the delay time of the output circuit 16. Therefore, it is to be understood that the timing of outputting data from the output data terminal DQ is delayed by a phase of 120 degrees from the external clock CLK.

Figure 8:
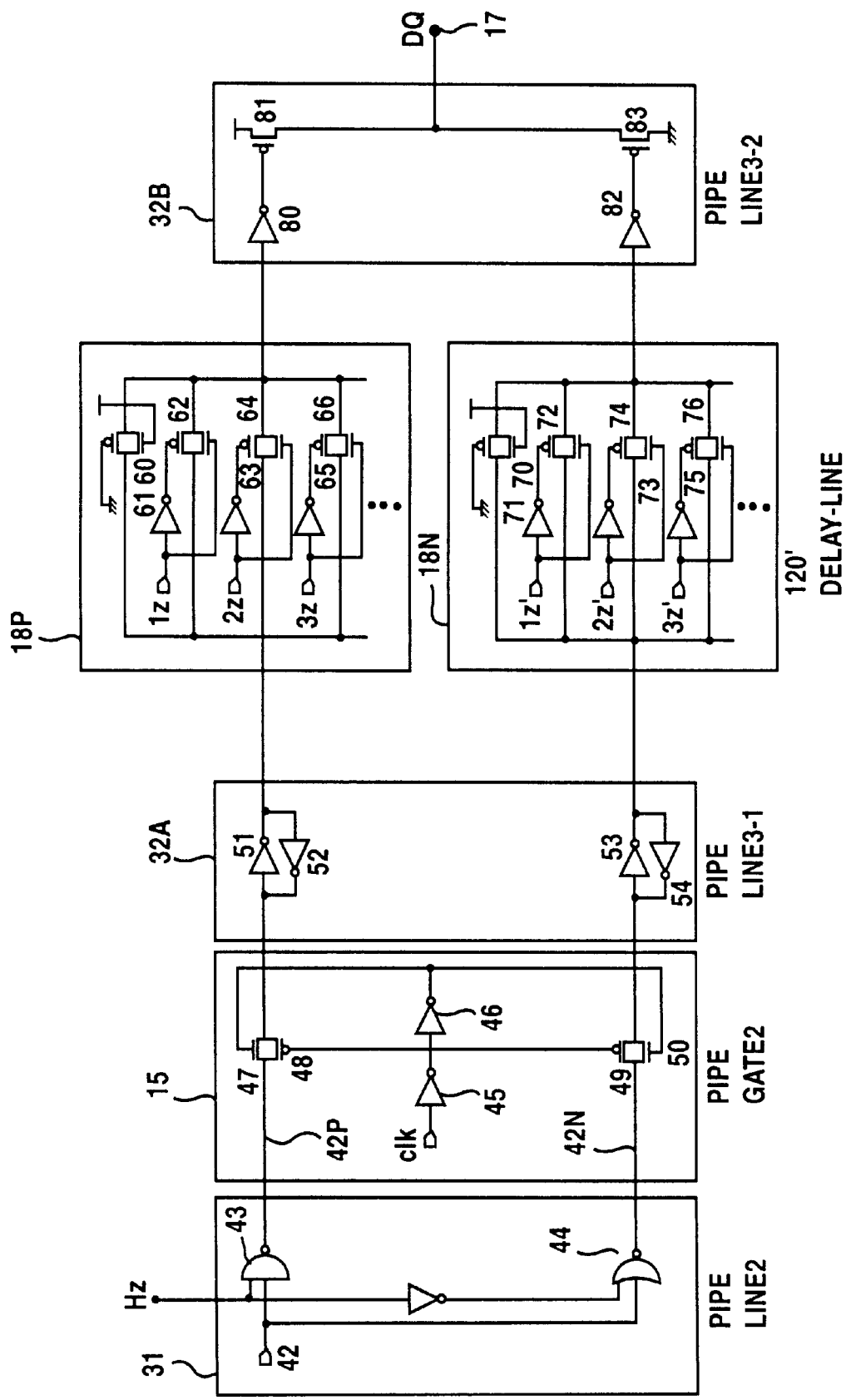
FIG. 8 is a diagram depicting specific circuits of the delay circuit and the output data buffer.

FIG. 8 is a diagram depicting specific circuits of the delay circuit 18 and the output data buffer 32. In this example, the output data buffer 32 is separated into a latch circuit portion 32A and an output terminal driving portion 32B between which the delay circuit 18 is inserted.

In the data bus controller 31 corresponding to the second stage of pipe-line circuit, output data 42 is separated into a P-channel drive signal 42P and an N-channel drive signal 42N via a NAND gate 43 and a NOR gate 44. A high-impedance control signal Hz is given as the other input to the NAND gate 43 and the NOR gate 44. In normal read mode, the high-impedance control signal Hz is at an H level and the NAND gate 43 and the NOR gate 44 invert the output data 42 to yield the P-channel drive signal 42P and N-channel drive signal 42N. In standby mode, the high-impedance control signal Hz becomes an L level, forcibly setting the output of the NAND gate 43 to an H level and the output of the NOR gate 44 to an L level. As a result, the P-channel drive signal 42P and the N-channel drive signal 42N are forced into an H level and L level, respectively.

In the pipe-line gate 15, the internal clock clk is supplied to CMOS transfer gates 47, 48, 49 and 50 via inverters 45 and 46. When the internal clock clk becomes an H level, therefore, those gates are opened to send the P-channel drive signal 42P and the N-channel drive signal 42N to the output buffer 32A.

The latch portion 32A of the output data buffer has a latch circuit comprising inverters 51 and 52 and a latch circuit comprising inverters 53 and 54. The P-channel drive signal 42P and the N-channel drive signal 42N are therefore respectively latched by those latch circuits.

The delay circuit 18 has a delay circuit 18P which delays the P-channel drive signal 42P and a delay circuit 18N which delays the N-channel drive signal 42N. The delay circuit 18P for delaying the P-channel drive signal 42P has a CMOS transfer gate 60 which is normally enabled and CMOS transfer gates 62, 64, 66 and so forth whose enablements are respectively controlled by delay control signals 1z, 2z and so forth. Inverters 61, 63, 65 and so forth respectively invert the delay control signals 1z, 2z and so forth. The delay circuit 18N for delaying the N-channel drive signal 42N has a CMOS transfer gate 70 which is normally enabled and CMOS transfer gates 72, 74, 76 and so forth whose enablements are respectively controlled by delay control signals 1z', 2z' and so forth. Inverters 71, 73, 75 and so forth respectively invert the delay control signals 1z', 2z' and so forth.

When the delay control signals are all at L levels, only the gates 60 and 70 in the delay circuit 18 are enabled and the resistance thereof becomes maximum, maximizing the delay time. As the number of the delay control signals which have H levels increases, the associated gates are enabled in addition to the gates 60 and 70 so that the resistance becomes lower, making the delay time shorter. The delay control signal S38 of the delay controller 38 is the aforementioned control signals 1z, 2z, . . . , 1z', 2z' and so forth. The delay controller 38 generates the delay control signal S38 in accordance with the phase-comparison result signal S36 of the phase comparator 36 in such a way that the clock clkb becomes in phase with the clock clka.

Figure 9:
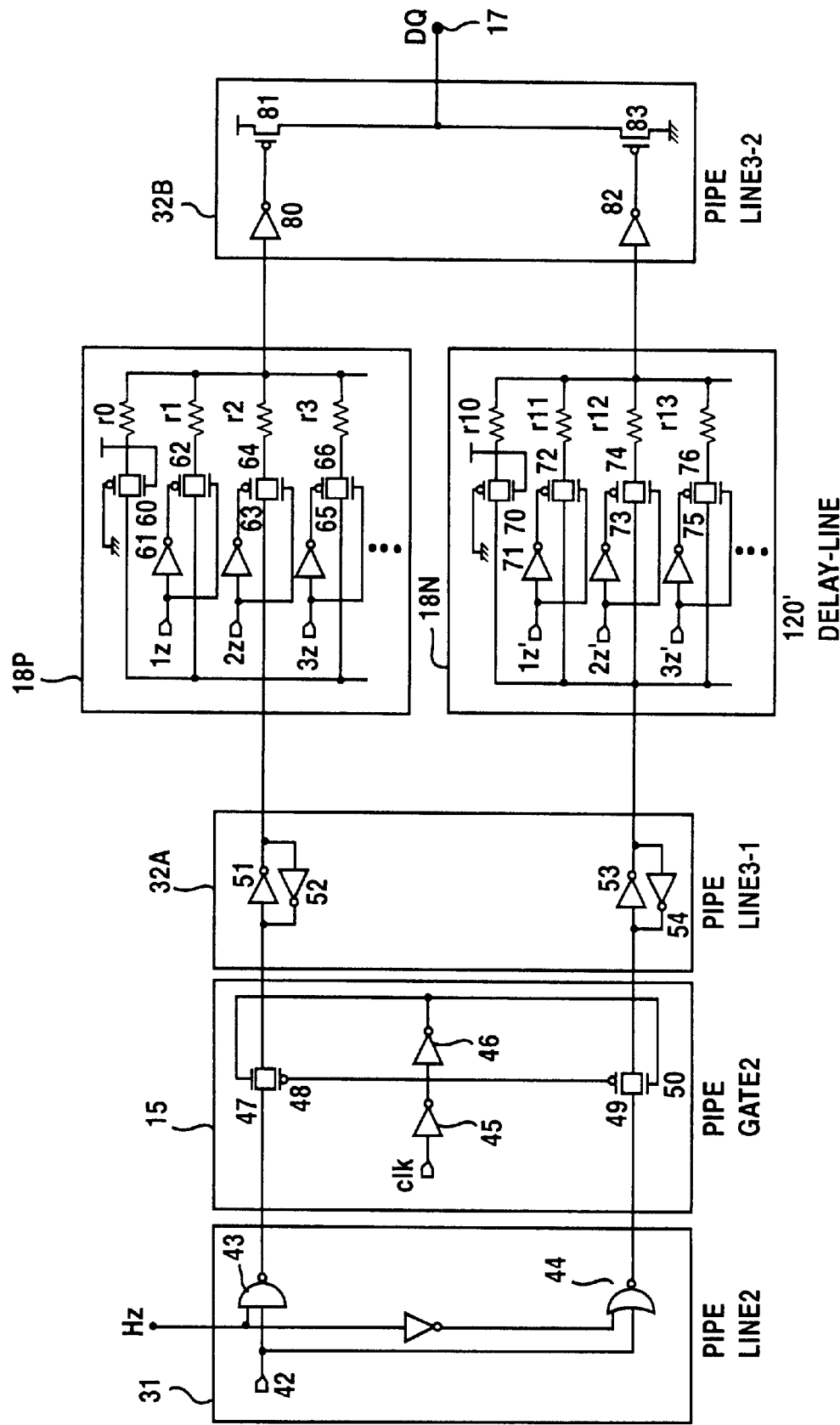
FIG. 9 is a diagram illustrating a modification of the delay circuit in FIG. 8.

FIG. 9 is a diagram illustrating a modification of the delay circuit 18 in FIG. 8. Like or same reference numerals are given to those components which are the same as the corresponding components shown in FIG. 8. In this modification, resistors r0, r1, r2, r3, . . . , r10, r11, r12, r13, and so forth are connected in series to the respective transfer gates. This structure can provide a more sufficient variation in delay time than the CMOS transfer gates alone.

Figure 10:
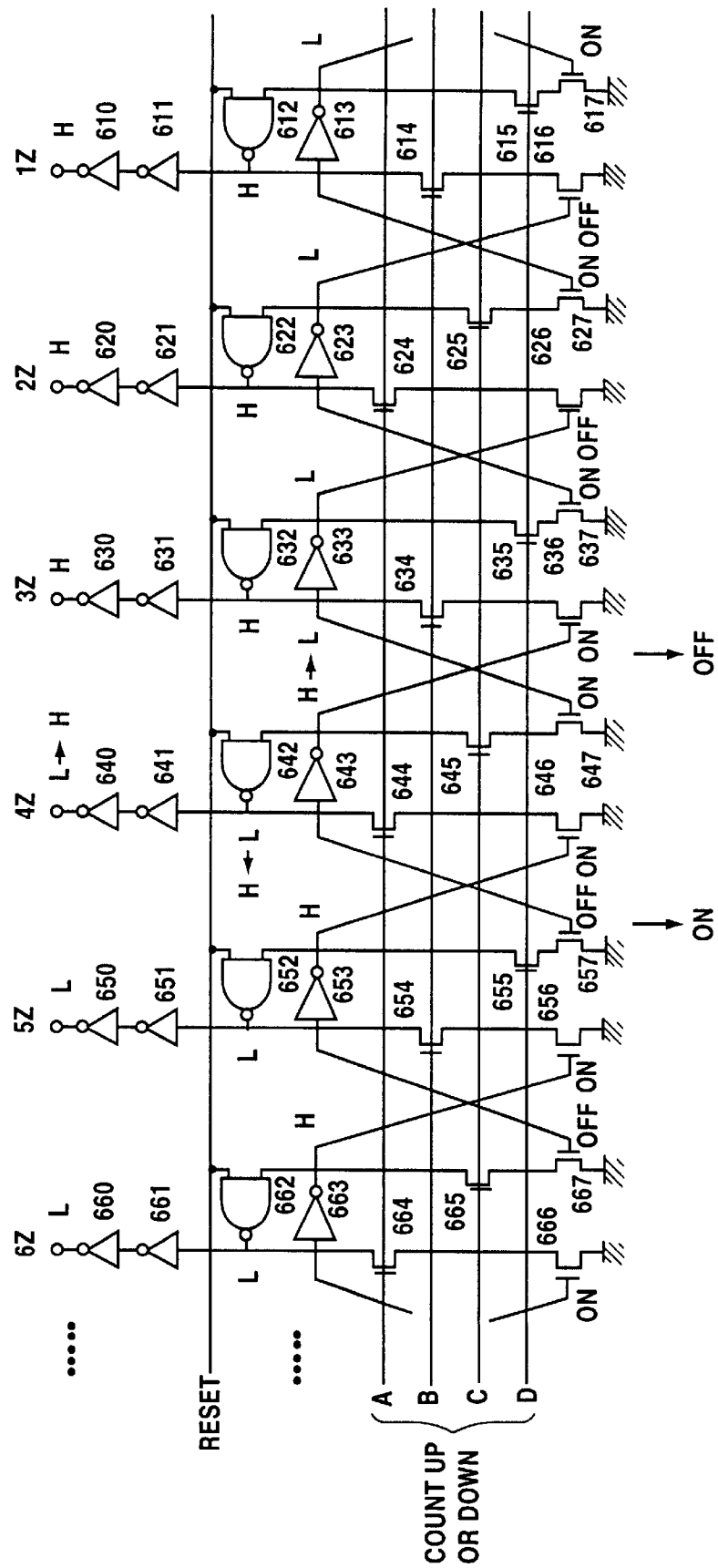
FIG. 10 is a circuit diagram of the delay controller.

FIG. 10 is a circuit diagram of the delay controller 38. This figure shows a part of the delay controller 38 and control signals 1z to 6z of the delay circuit for the sake of descriptive convenience. This delay controller 38 receives detection signals A to D (S36) from the phase comparator 36, and the boundary between the H level (the right-hand side) and the L level (the left-hand side) of each control signal is shifted rightward by the signals A and B while the boundary between the H level (the right-hand side) and the L level (the left-hand side) of each control signal is shifted leftward by the signals C and D. In other words, the signals A and B increase the amount of delay to produce the control signal which delays the clock clkb more, and the signals C and D reduce the amount of delay to produce the control signal which makes the clock clkb advance further.

Each stage of the delay controller 38, e.g., the first stage, has a latch circuit comprising a NAND gate 612 and an inverter 613. The first stage further comprises transistors 614 and 615 which forcibly invert the status of the latch circuit 612, 613. Transistors 616 and 617 are provided to inhibit the latch circuit from being inverted by the transistors 614 and 615 when it is not to be inverted. The second to sixth stages have the same structures. All of those transistors are of an N channel type.

Suppose that the first to third stages of control signals 1z to 3z are at H levels. The fourth and subsequent control signals 4z, 5z and so forth on the left-hand side are all at L levels. The statuses of the individual stages of latch circuits are as indicated by "H" or "L" in FIG. 10. Specifically, while the first to third stages of latch circuits have H-level NAND outputs and L-level inverter outputs, the fourth to sixth stages of latch circuits have L-level NAND outputs and H-level inverter outputs. Of transistors connected to the ground, therefore, the transistors 617, 627, 637, 647, 646, 656 and 666 are enabled (ON state). That is, the transistor 647 in the fourth stage of circuit and the transistor 636 in the third stage of circuit on both sides of the boundary in the latched state are enabled, and the latched state is invertible by the detection signal B or C.

If the detection signal C is given an H level, a transistor 645 is conductive to forcibly set the level of the output of an inverter 643 to an L level from an H level. Accordingly, the output of a NAND gate 642 is likewise changed to an H level from an L level and this status is latched. As the output of the NAND gate 642 becomes the H level, the output 4z of an inverter 640 goes to an H level from an L level. As a result, the delay control signals which have H levels are shifted from 1z to 3z to 1z to 4z. As has been discussed above with reference to FIGS. 8 and 9, as the number of H-level delay control signals increases, the number of parallel gates in the delay circuit which are conductive increases and the delay time of the delay circuit is controlled to be shorter. That is, control is performed to make the clock clkb advance further.

If the detection signal B is set to an H level, through an operation similar to the above-discussed one, the output of a NAND gate 632 in the third stage of latch circuit is forcibly changed to an L level, switching the level of the output of an inverter 633 to an H level. As a result, the delay control signal 3z goes to an L level. This reduces the number of H-level delay control signals, thus decreasing the number of parallel gates in the delay circuit which are conductive. Accordingly, the delay time of the delay circuit is controlled to become longer. That is, control is performed to delay the clock clkb further.

When the boundary between H and L levels appears between the outputs 5z and 4z or the outputs 4z and 3z, the boundary between H and L levels is controlled to be shifted rightward or leftward by the detection signal A or D. That is, the detection signals A and B carry out shift control in such a way as to reduce the number of H-level outputs while the detection signals C and D carry out shift control in such a way as to increase the number of H-level outputs. Further, the detection signals A and D carry out shift control when the outputs 2z, 4z and 6z are at H levels, and the detection signals B and C carry out shift control when the outputs 1z, 3z and 5z are at H levels.

Figure 11:
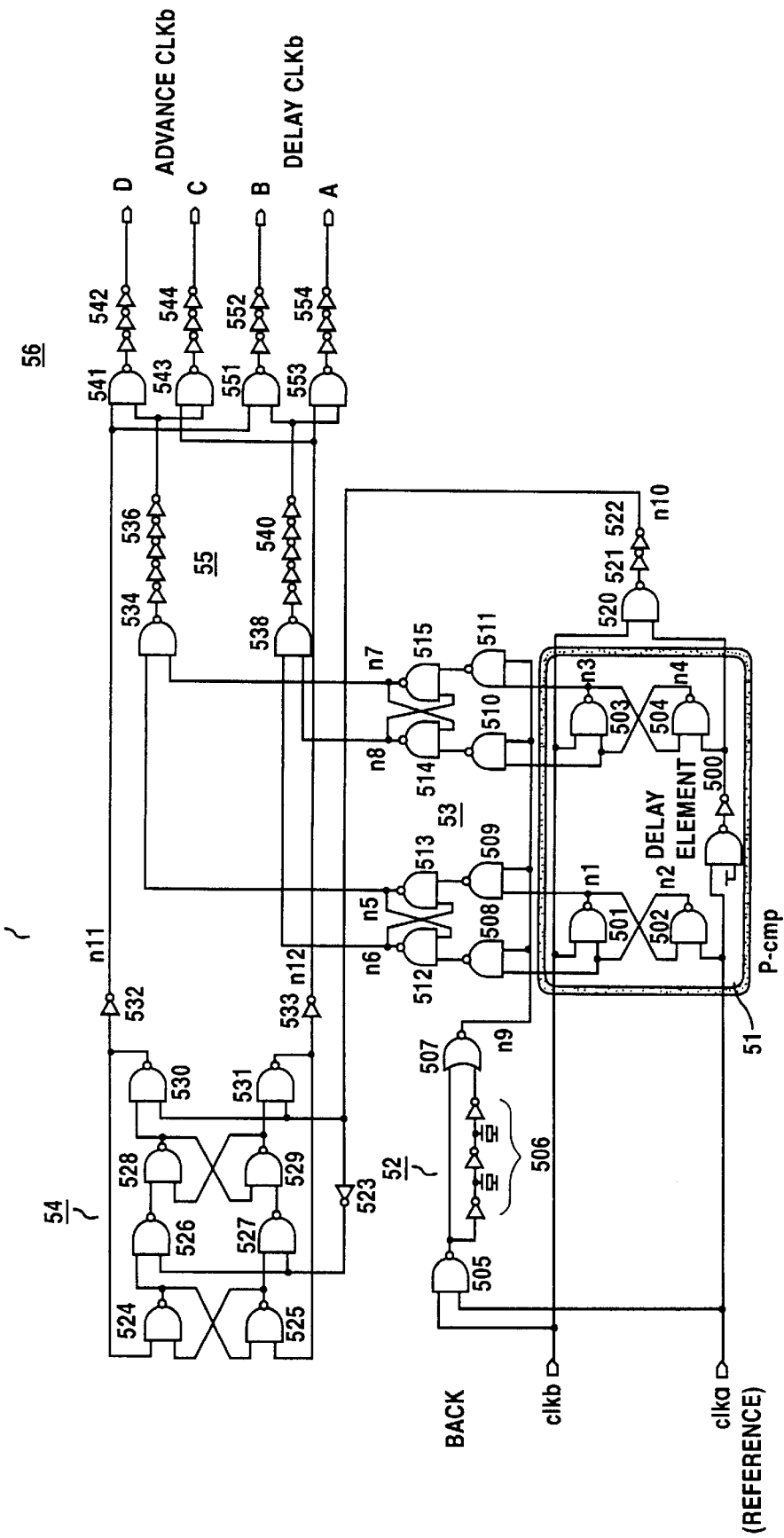
FIG. 11 is a detailed circuit diagram of the phase comparator 36.

FIG. 11 is a detailed circuit diagram of the phase comparator 36. This phase comparator 36 has a phase detector 51 which detects the relationship between the phases of the clock clkb given to its input terminal and the clock clka given to its reference clock terminal. This phase detector 51 has two latch circuits, and detects three cases: (1) when the phase of the clock clkb leads the phase of the clock clka by a given time or greater, (2) when the former phase and the latter one have a phase difference of less than the given time, and (3) when the former phase is delayed from the latter one by the given time or greater. Those three statuses are detected by combinations of the detection outputs n1 to n4.

A sampling pulse generator 52 sends a sampling signal to a node n9 when the two clocks clkb and clka both become H levels. A sampling latch circuit portion 53 samples the detection outputs n1–n4 using the sampling signal n9 by means of sampling gates 508 to 511, and latches the sampled signals in latch circuits which comprise NAND gates 512 and 513 and NAND gates 514 and 515. Therefore, the detection outputs n1–n4 at the sampling time are respectively latched at nodes n5 to n8.

A NAND gate 520 detects that both clocks clka and clkb become H levels. Then ½ frequency divider 54 frequency-divides a detection pulse n10 by two, yielding pulse signals n11 and n12 which are in the opposite phases. A decoder portion 55 decodes the sampled and latched signals at the nodes n5–n8, and sets the output of a series of inverters 536 to an H level when the clock clkb is delayed from the reference clock clka, sets the outputs of both the series of inverters 536 and another series of inverters 540 to L levels when the phases of both clocks match with each other, and sets the output of the series of inverters 540 to an H level when the clock clkb leads the reference clock clka. In response to the pulse signals n11 and n12 in the opposite phases, an output circuit portion 56 outputs the detection signals A–D in accordance with the output of the decoder portion 55. As has already been explained, the detection signals A–D (S36) control the status of the delay controller 38.

Figure 12:
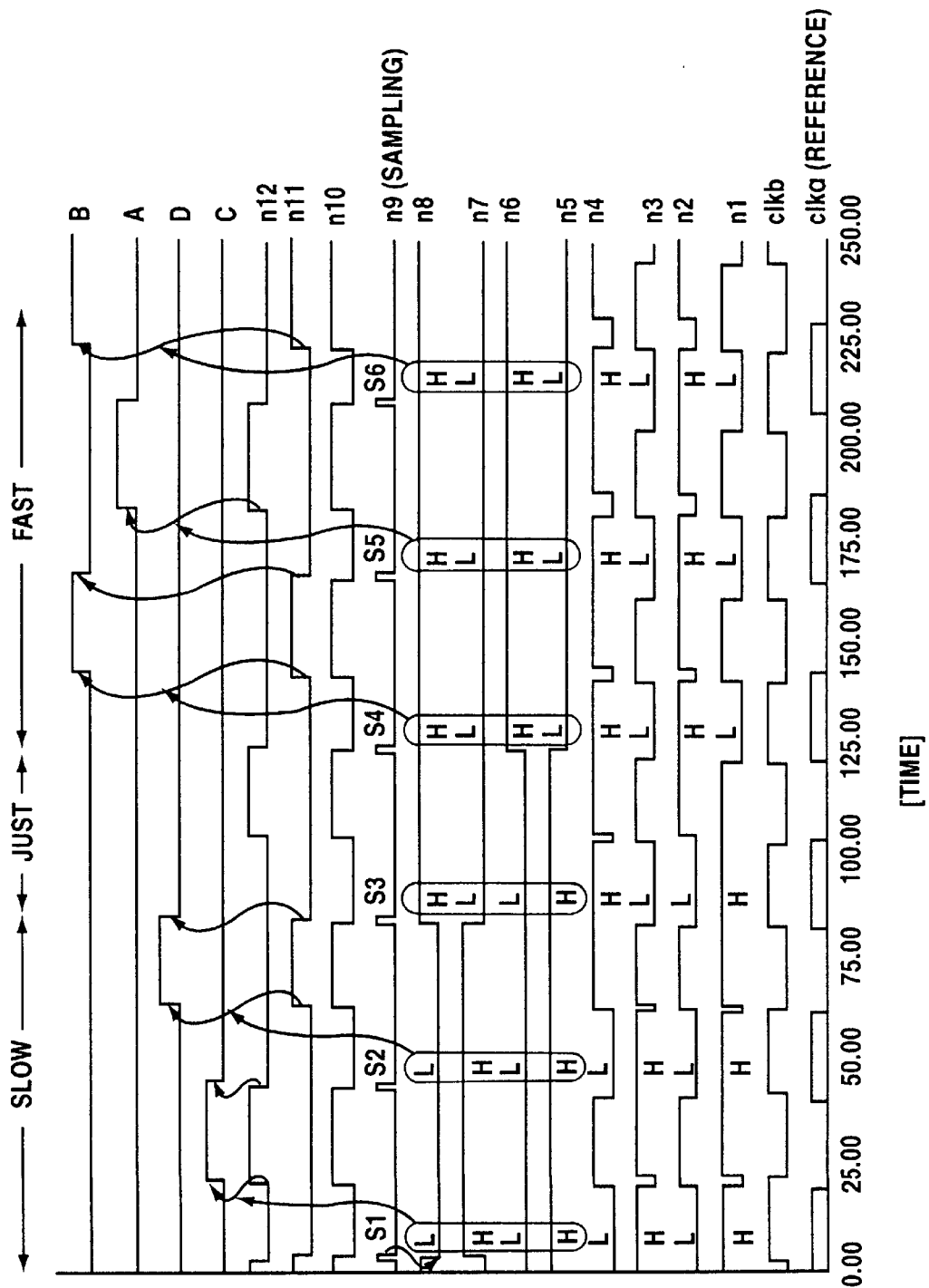
FIG. 12 is a timing chart diagram illustrating the operation of the circuitry in FIG. 11.

FIG. 12 is a timing chart diagram illustrating the operation of the circuitry in FIG. 11. This figure shows in order the clock clkb delayed from the reference clock clka, both clocks in phase and the clock clkb leading the reference clock clka. Specifically, when the sampling pulse n9 is at S1 and S2, in which case the clock clkb is delayed, the delayed status is detected, the detection signal C of an H level is output in response to the pulse n12, or the detection signal D of an H level is output in response to the pulse n11, thus controlling the clock clkb to advance. When the sampling pulse is at S3, the phases of both clocks coincide with each other and the detection signals A–D all become L levels. When the sampling pulse is at S4, S5 and S6, in which case the clock clkb is leading, the leading status is detected, the detection signal B becomes an H level in response to the pulse n11 or the detection signal A becomes an H level in response to the pulse n12, so that the clock clkb is controlled to be delayed.

The above-described operation will now be explained in sequence.

[Sampling Pulse S1]

In this period, the clock clkb is delayed, so that the clock clka becomes H levels earlier than clkb from the both clocks L level, and the signal of an L level at the node n2 and the signal of an H level at the node n1 are latched. A NAND and inverter 500 is a delay element which delays the clock clka by a given time. NAND gates 503 and 504 likewise latch the signal at node n3=H level and the signal at node n4=H level, respectively. The sampling pulse generator 52 generates the sampling pulse n9 which has a width equivalent to the delay time of a delay circuit 506 from the timing at which both clocks clka and clkb become H levels the latched state in the phase detector 51 is sampled and is latched in the latch circuit portion 53. That is, the states at the nodes n1–n4 are transferred to the nodes n5–n8.

Then, the pulse n10 is generated at the timing when both clocks clka and clkb become H levels. In the ½ frequency divider 54, the latch circuit of NAND gates 524 and 525 and the latch circuit of NAND gates 528 and 529 are coupled together by gates 526, 527 and gates 530 and 531, and those gates 526, 527 and 530, 531 are opened by inverted and non-inverted pulses of the pulse n10 alternately. Thus, the pulse n10 is frequency-divided by two.

In the decoder portion 55, the output of the series of inverters 536 becomes an H level and the output of the series of inverters 540 becomes an L level in accordance with the levels of the nodes n5–n8 which are the H, L, H and L levels, respectively. In response to the pulse n12, therefore, the H level of the series of inverters 536 sets the detection signal C to an H level via a NAND gate 543 and a series of inverters 544. The H-level detection signal C shifts the boundary between the H level and L level of the delay controller 38 leftward to reduce the resistance of the delay circuit 18, thereby shortening the delay time. Consequently, the clock clkb is controlled in the advancing direction.

[Sampling Pulse S2]

As in the above case, the delayed status of the clock clkb is detected by the phase detector 51, and the detection signal D becomes an H level in response to the pulse n11. As in the previous case, therefore, the boundary between the H level and L level of the delay controller 38 is shifted leftward to shorten the delay time of the delay circuit 18.

[Sampling Pulse S3]

At the timing when the sampling pulse S3 is output, the phases of both clocks clka and clkb substantially match with each other. In the case where there is a phase difference within the delay time of the delay element 505 and the clock clkb is delayed slightly, the latched states become n1=H, n2=L, n3=L, n4=H, n5=H, n6=L, n7=L and n8=H.

This is illustrated in FIG. 12. In the case where there is a phase difference within the delay time of the delay element 505 and the clock clkb is leading slightly, the latched states become n1=L, n2=H, n3=H, n4=L, n5=L, n6=H, n7=H and n8=L.

In either case, the latched states are decoded in the decoder portion 55 and the outputs of both series of inverters 536 and 540 become L levels so that the detection outputs A–D all become L levels. As a result, the status of the delay controller 38 does not change, causing no change in the delay time of the delay circuit 18.

[Sampling Pulses S4, S5 and S6]

In this case, the clock clkb is leading. The latched states in the phase detector 51 become n1=L, n2=H, n3=L and n4=H.

Consequently, the sampled latched states in the latch circuit portion 53 also become n5=L, n6=H, n7=L and n8=H.

Those states are decoded in the decoder portion 55, so that the output of the series of inverters 536 becomes an L level and the output of the series of inverters 540 becomes an H level. Therefore, the detection signals B and A both become H levels in response to the pulses n11 and n12. Consequently, the boundary between the H level and L level of the delay controller 38 is shifted rightward to increase the resistance of the delay circuit 18, thereby making the delay time longer. The clock clkb is therefore controlled in the delay direction.

As apparent from the above, the internal clock clk and the DLL circuit which is formed by the closed loop of the phase comparator 36, the delay controller 38, the dummy delay circuit 40 and the dummy output circuit 41 perform control in such a way that the phase of the clock clka, which is the internal clock clk delayed by 120 degrees, coincides with the phase of the clock clkb which has the same timing as the output timing of the output data buffer 32. Therefore, the delay circuit 18 provides the delay time that delays the timing of the output DQ by a phase of 120 degrees from the external clock CLK.

Each of the delay circuits 18 shown in FIGS. 8 and 9 has the paths 60 and 70 which allow the P-channel drive signal 42P and the N-channel drive signal 42N to pass through at least the delay circuit 18 without going through logic gates. This structure guarantees that the control signal Hz for setting the output terminal DQ in a high-impedance state at the power-on time or the like can pass through the delay circuit 18 without delay to cause both transistors 81 and 83 non-conductive. This structure is thus suitable as the delay circuit 18 which is provided inside or at the preceding stage of the output data buffer.

Figure 13:
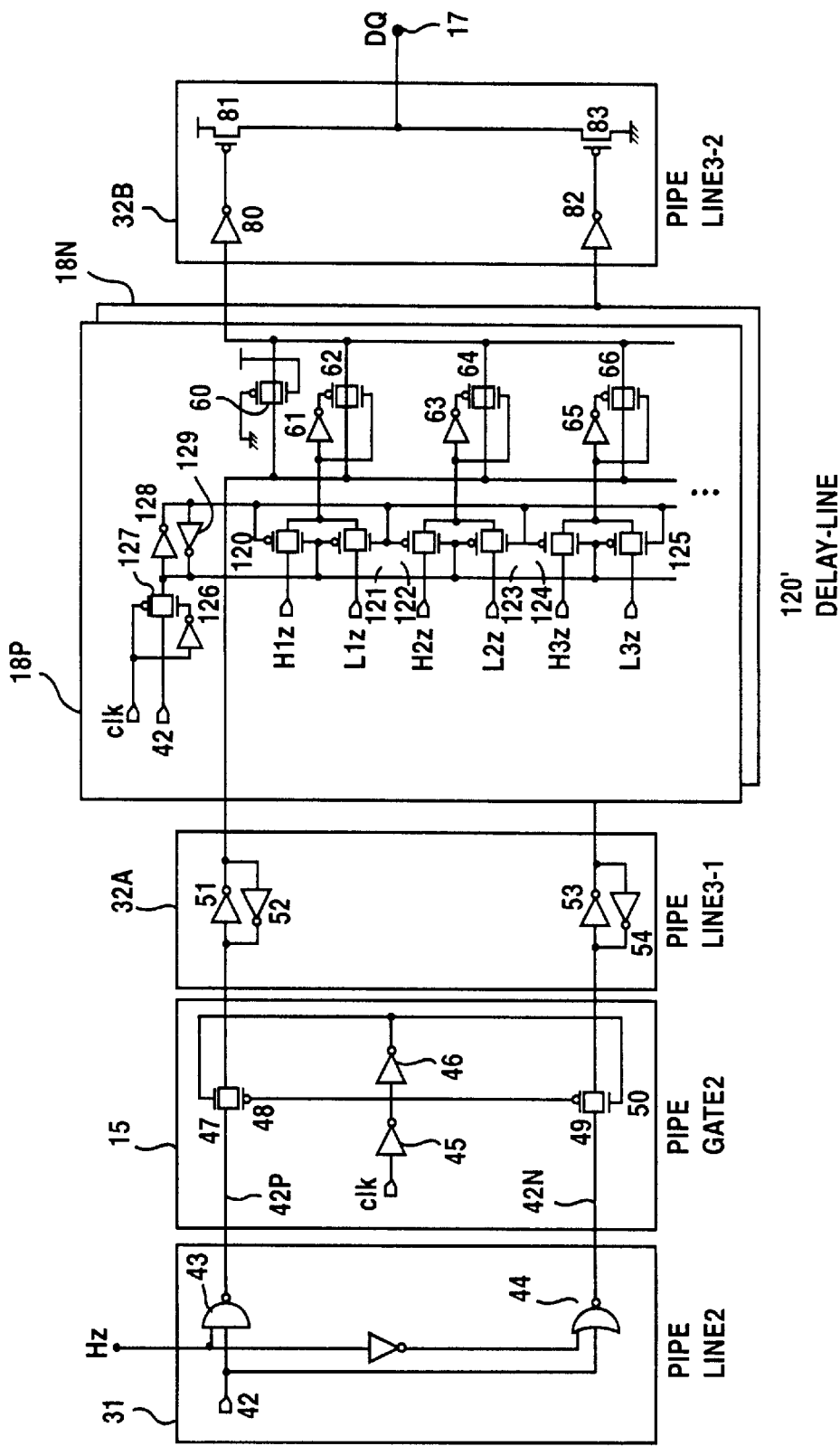
FIG. 13 is a diagram showing specific circuits of another example of the delay circuit and an input/output data buffer.

FIG. 13 is a diagram showing specific circuits of another example of the delay circuit and an input/output data buffer. In this example, the input/output data buffer 32, the pipe-line gate 15 and the data bus controller 31 are the same as those in the circuits in FIGS. 8 and 9. It is delay circuits 18P and 18N that differ from the circuits in FIGS. 8 and 9.

The input/output data buffer 32, as illustrated, has an output stage 32B which is an inverter circuit of a P type transistor 81 and an N type transistor 83. Therefore, the speed of the level change of the output DQ from an L level to an H level caused by the enabled P type transistor 81 differs from the speed of the level change of the output DQ from an H level to an L level caused by the enabled N type transistor 83. Strictly speaking, therefore, when the output DQ changes to the H level from the L level, the delay characteristic of the output stage should be set to the delay time which corresponds to the level-changing speed, whereas when the output DQ changes to the L level from the H level, the delay characteristic should be set to the delay time which corresponds to the level-changing speed.

The delay circuit 18 in FIG. 13 is designed to meet such a demand; it is controlled by delay control signals H1z, H2z and so forth when the output DQ changes to the H level and it is controlled by delay control signals L1z, L2z and so forth when the output DQ changes to the L level. To switch the two types of delay control signals from one to the other, a data signal 42 which is supplied to the data bus controller 31 quickly is latched in a latch circuit 128, 129 via a gate 127 at the falling edge of the internal clock clk. The control signal held in this latch circuit controls whether the gates 120, 122 and 124 should be opened to accept the delay control signals H1z, H2z and so forth for the case of the output DQ changing its level to the H level or the gates 121, 123 and 125 should be opened to accept the delay control signals L1z, L2z and so forth for the case of the output DQ changing its level to the L level.

Figure 14:
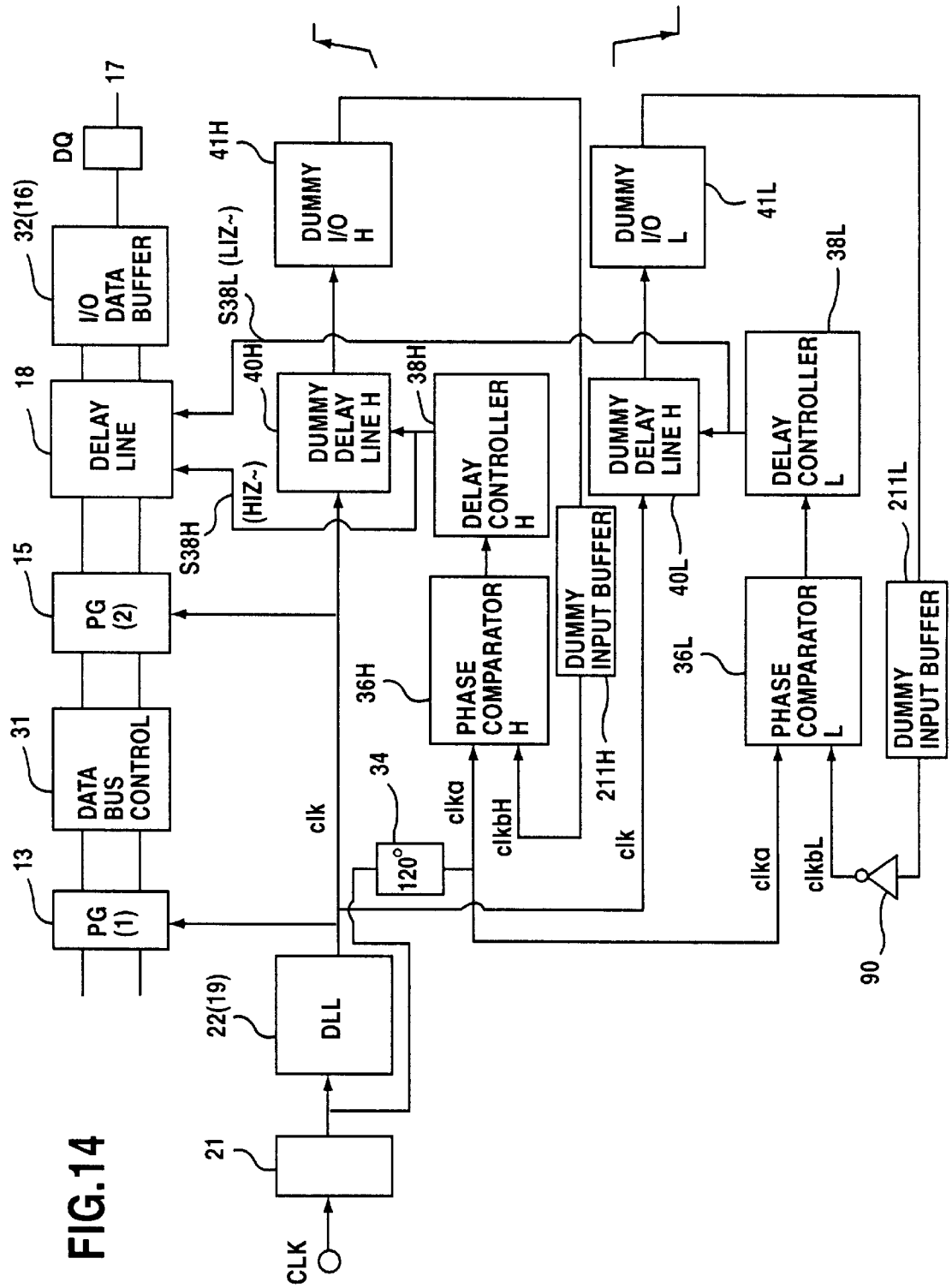
FIG. 14 is a diagram showing a circuit which generates two types of delay control signals S38H (H1z~) and S38L (L1z~) to be supplied to the delay circuit 18 in FIG. 13.

FIG. 14 is a diagram showing a circuit which generates two types of delay control signals S38H (H1z~) and S38L (L1z~) to be supplied to the delay circuit 18 in FIG. 13. In this diagram, the pipe-line gates 13 and 15, the data bus controller 31, the input/output data buffer 32, the input buffer 21 for the external clock CLK, the DLL circuit 22, etc. are the same as those in FIG. 7. To generate the delay control signal S38H when the output DQ changes to the H level, the circuit in FIG. 14 further has a DLL circuit which comprises a phase comparator 36H, a delay controller 38H, a dummy delay circuit 40H, a dummy input/output circuit 41H and a dummy input buffer 211H. To generate the delay control signal S38L when the output DQ changes to the L level, the circuit in FIG. 14 further has a DLL circuit which comprises a phase comparator 36L, a delay controller 38L, a dummy delay circuit 40L, a dummy input/output circuit 41L and a dummy input buffer 211L. In other words, the DLL circuit structure in the circuit in FIG. 7 is provided in double in order to generate the delay control signals S38H and S38L.

The phase comparators 36H and 36L, the delay controllers 38H and 38L, etc. in FIG. 14 are the same as those shown in FIGS. 11 and 10, but the dummy input/output circuits 41H and 41L in FIG. 14 have different structures.

Figure 15:
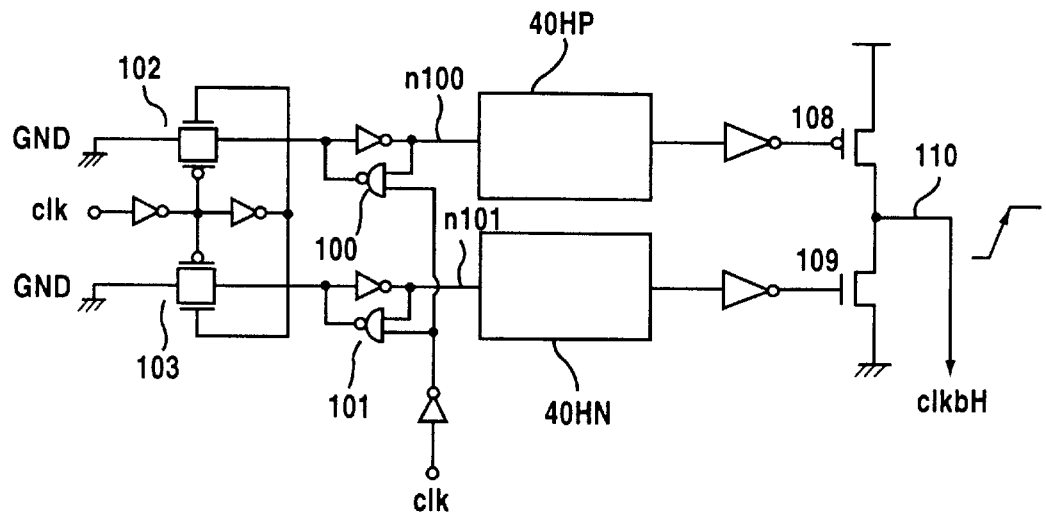
FIG. 15 is a diagram exemplifying the dummy delay circuit 41H for changing the level of the output DQ to the H level from the L level.

FIG. 15 is a diagram exemplifying the dummy delay circuit 41H for changing the level of the output DQ to the H level from the L level. This dummy delay circuit 41H is analogous to a combination of the output circuits and the delay circuits illustrated in FIGS. 8 and 9. It is to be noted however that since the dummy delay circuit need not actually output data read from the memory, inputs to be given to transfer gates 102 and 103 corresponding to the last pipe-line gate are connected to the ground to be normally set to L levels. Further differences from the circuits in FIGS. 8 and 9 lie in that NAND gates 100 and 101 are provided instead of inverters in the latch circuit portion and nodes n100 and n101 are forcibly set to L levels by the L-level internal clock clk.

The following will discuss the operation of the dummy delay circuit in FIG. 15. In response to the L-level internal clock clk, the nodes n100 and n101 are forcibly set to L levels as mentioned above. As a result, an N type transistor 109 in the output portion is enabled (conductive), setting an output 110 or clock clkbH to an L level. When the internal clock clk becomes an H level, transistors 102 and 103 are enabled to invert the latched state of the latch circuit so that the node n100 and n101 become H levels. Those signals are delayed by dummy delay circuits 40HP and 40HN to enable a P type transistor 108 in the output section. Consequently, the output 110 or the clock clkbH always changes its level to an H level from the L level when the internal clock clk has an H level. This clock clkbH is set in phase with the frequency-divided reference clock clka, the delay control signal S38H becomes the control signal that can keep the timing of switching the level of the output to the H level from the L level at a predetermined phase difference (e.g., 120 degrees) from the external clock.

Figure 16:
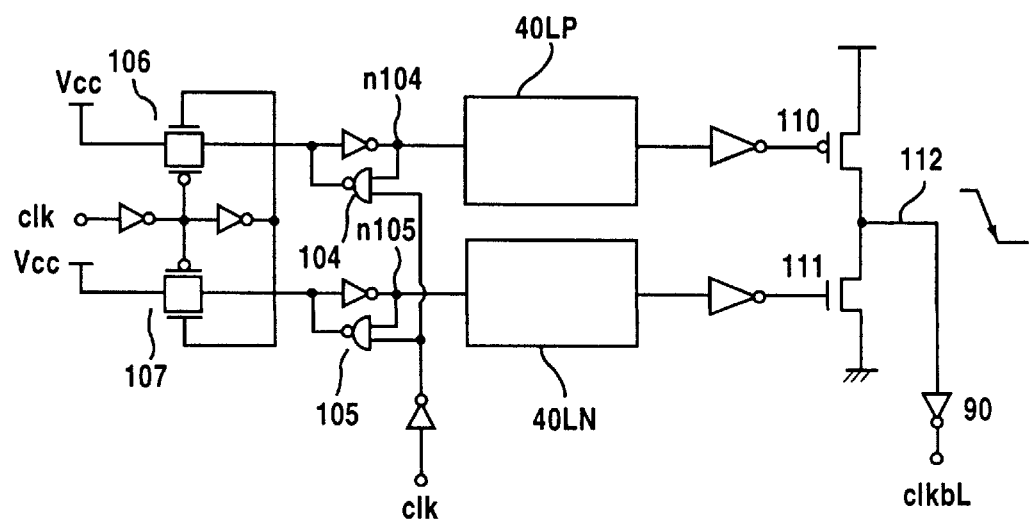
FIG. 16 is a diagram exemplifying the dummy delay circuit 41L for changing the level of the output DQ to the L level from the H level.

FIG. 16 is a diagram exemplifying the dummy delay circuit 41L for changing the level of the output DQ to the L level from the H level. This circuit is substantially the same as the one shown in FIG. 15. The differences lie in that the inputs to transfer gates 106 and 107 are fixed to the H level of a power supply Vcc and NOR gates 104 and 105 for forcibly setting nodes n104 and n105 to H levels in response to the inverted signal of the internal clock clk are provided in the latch circuit.

The following will discuss the operation of the dummy delay circuit in FIG. 16. In response to the L-level internal clock clk, the nodes n104 and n105 are forcibly set to H levels as mentioned above. As a result, a P type transistor 110 in the output portion is enabled, setting an output 112 to an H level. When the internal clock clk becomes an H level, transistors 106 and 107 are enabled (conductive) to invert the latched state of the latch circuit so that the node n104 and n105 become L levels. Those signals are delayed by dummy delay circuits 40LP and 40LN to enable an N type transistor 111 in the output section. As a result, the output 112 always changes its level to an L level from the H level when the internal clock clk has an H level. The inverted clock clkbL of this output 112 is set in phase with the frequency-divided reference clock clka, the delay control signal S38L becomes the control signal that can keep the timing of switching the level of the output to the L level from the H level at a predetermined phase difference (e.g., 120 degrees) from the external clock.

A DLL circuit which may be replaced with those shown in FIGS. 14–16 is illustrated in, for example, Unexamined Japanese Patent Publication No. Hei 8-339988 filed on Dec. 19, 1996.

According to the above-embodiment, the reference clock clka is delayed by 120° phase of external clock CLK. The present invention is not limited to 120° phase delay for the reference clock clkb. The reference clock clkb can have any phase relation with the external clock CLK.

According to this invention, as apparent from the foregoing description, the pipe-line control of the internal circuits is executed with a sufficient operational margin in synchronism with the internal clock which does not depend on the period of the external clock and has a delay timing with respect to the external clock, and the timing of the output signal is so controlled by the delay circuit, connected to the output circuit, as to have a predetermined phase difference with respect to the external clock. Therefore, the internal pipe-line circuit can operate with enough margin.

What is more, while the delay circuit is controlled by the delay control signal which is generated by the DLL circuit, the generation of the high-impedance output from the output terminal is not delayed by the delay circuit because the delay circuit has inside a delay path which is not controlled by the delay control signal. Therefore, it is possible to cause the output terminal to be high impedance state without unnecessary delay at the delay circuit.

What is claimed is:

1. A semiconductor integrated circuit device having plural stages of internal circuits operable in a pipe-line and an output circuit, connected to said internal circuits, for outputting an output signal with a first phase relation to an external clock, said device comprising:

pipe-line gates, provided between said internal circuits and between one of said internal circuits and said output circuit, opening and closing of said pipe-line gates being controlled by an internal clock with a second phase relation to the external clock; and a delay circuit located at a subsequent stage of a last stage pipeline gate which is provided between said internal circuit and said output circuit, and having a delay time for permitting said output signal to be output with said first phase relation.

2. The semiconductor integrated circuit device according to claim 1, wherein a first stage of internal circuit starts operating in response to said external clock and outputs a process result after passage of a first period; and said internal clock has a timing for closing said pipe-line gates in said first period.

3. The semiconductor integrated circuit device according to claim 1, wherein said internal clock has a phase advanced from that of said external clock by a time equivalent to a delay time of said output circuit.

4. The semiconductor integrated circuit device according to claim 1, further comprising a delayed lock loop circuit for comparing a phase of a reference clock having said first phase relation to said external clock with a phase of a variable signal having a timing of said output signal of said output circuit and for generating delay control signals kept said reference clock and variable signal in substantially the same phase; and wherein said delay time of said delay circuit is controlled by said delay control signals .

5. The semiconductor integrated circuit device according to claim 4, wherein said delay circuit has at least one delay path which is not controlled by said delay control signals.

6. The semiconductor integrated circuit device according to claim 4, wherein said delayed lock loop circuit generates a first delay control signal corresponding to a first timing at which said output signal of said output circuit changes to an H level from an L level and a second delay control signal corresponding to a second timing at which said output signal of said output circuit changes to said L level from said H level; and said delay circuit is controlled by one of said first and second delay control signals in accordance with said H level or L level of said output signal of said output circuit.

7. A semiconductor memory device having plural stages of column associated internal circuits supplied with a column address signal and operable in a pipe-line and an output circuit, connected to said column associated internal circuits, for outputting a data output signal with a predetermined phase relation to an external clock, said device comprising:

pipe-line gates, provided between said column associated internal circuits and between said column associated internal circuit and said output circuit, opening and closing of said pipe-line gates being controlled by an internal clock having a phase advanced from that of said external clock by a time equivalent to a delay time of said output circuit; and a delay circuit located at a subsequent stage of a last stage pipe-line gate which is provided between said column associated internal circuit and said output circuit, and having a delay time corresponding to said predetermined phase relation.

8. The semiconductor memory device according to claim 7, further comprising a delayed lock loop circuit for comparing a phase of a reference clock having said predetermined phase relation to said external clock with a phase of a variable signal having a timing of said output signal of said output circuit and for generating delay control signals kept said reference clock and variable signal in substantially the same phase; and wherein said delay time of said delay circuit is controlled by said delay control signals.

9. The semiconductor memory device according to claim 8, wherein said delay circuit has at least one delay path which is not controlled by said delay control signals.

10. The semiconductor integrated circuit device according to claim 1, wherein said delay circuit is located between said output circuit and the last pipe-line gate.

11. The semiconductor integrated circuit device according to claim 1, wherein said delay circuit is located inside said output circuit.

12. The semiconductor memory device according to claim 7, wherein said delay circuit is located between said output circuit and the last pipe-line gate.

13. The semiconductor memory device according to claim 7, wherein said delay circuit is located inside said output circuit.

* * * * *